(12) United States Patent
Burkholder

(10) Patent No.: US 7,284,882 B2
(45) Date of Patent: Oct. 23, 2007

(54) LED LIGHT MODULE ASSEMBLY

(75) Inventor: Greg Eugene Burkholder, Ft. Wayne, IN (US)

(73) Assignee: Federal-Mogul World Wide, Inc., Southfield, MI (US)

( * ) Notice: Subject to any disclaimer, the term of this patent is extended or adjusted under 35 U.S.C. 154(b) by 26 days.

(21) Appl. No.: 11/354,674

(22) Filed: Feb. 15, 2006

(65) Prior Publication Data

US 2006/0181878 A1    Aug. 17, 2006

Related U.S. Application Data

(60) Provisional application No. 60/654,027, filed on Feb. 17, 2005.

(51) Int. Cl.
 *F21V 29/00* (2006.01)
(52) U.S. Cl. .................. 362/294; 362/373; 362/800; 257/712
(58) Field of Classification Search ............... 362/294, 362/373, 278, 800; 257/99, 100, 712, 713, 257/717, 720
See application file for complete search history.

(56) References Cited

U.S. PATENT DOCUMENTS

| | | | | |
|---|---|---|---|---|
| 5,552,637 A | * | 9/1996 | Yamagata | 257/717 |
| 5,857,767 A | * | 1/1999 | Hochstein | 362/294 |
| 6,045,240 A | | 4/2000 | Hochstein | 362/294 |
| 6,375,340 B1 | | 4/2002 | Biebl et al. | 362/294 |
| 6,392,888 B1 | | 5/2002 | Chen et al. | 361/704 |
| 6,428,189 B1 | | 8/2002 | Hochstein | 362/373 |
| 6,517,218 B2 | | 2/2003 | Hochstein | 362/294 |
| 6,568,833 B2 | | 5/2003 | Worgan et al. | 362/247 |
| 6,573,536 B1 | | 6/2003 | Dry | 257/88 |
| 6,578,986 B2 | | 6/2003 | Swaris et al. | 362/249 |
| 6,590,773 B1 | | 7/2003 | Lin | 361/704 |
| 6,614,103 B1 | | 9/2003 | Durocher et al. | 257/678 |
| 6,641,284 B2 | | 11/2003 | Stopa et al. | 362/240 |
| 6,834,977 B2 | | 12/2004 | Suchiro et al. | 362/187 |
| 6,846,093 B2 | | 1/2005 | Swaris et al. | 362/249 |
| 6,874,911 B2 | | 4/2005 | Yoneda | 362/294 |
| 6,963,131 B2 | * | 11/2005 | Frisch et al. | 257/712 |
| 6,999,318 B2 | * | 2/2006 | Newby | 361/719 |
| 7,165,863 B1 | * | 1/2007 | Thomas et al. | 362/219 |
| 2002/0185726 A1 | * | 12/2002 | North et al. | 257/707 |

(Continued)

FOREIGN PATENT DOCUMENTS

CA    2 342 140    9/2001

*Primary Examiner*—Alan Cariaso
*Assistant Examiner*—Leah S. Lovell
(74) *Attorney, Agent, or Firm*—Dickinson Wright PLLC

(57) ABSTRACT

An LED light module assembly for use with high power, high light output LED's includes a thin flexible circuit board with surface mounted LED's and other electronic components which is attached to a metal heat sink using a layer of a thermally conductive adhesive, such as a thermally conductive epoxy adhesive. A conduction path is provided from the LED carrier through the flexible circuit board by the incorporation of one or more thermally conductive vias in the region of the attachment pad used to bond the LED to the flexible circuit board. These vias provide a conduction path from the back side of the LED carrier through the circuit board to the thermally conductive adhesive and heat sink. The LED light module assembly has the capacity to dissipate between about 10-14 W of power without exceeding a maximum LED junction temperature of about 125° C.

23 Claims, 6 Drawing Sheets

U.S. PATENT DOCUMENTS

| | | | |
|---|---|---|---|
| 2003/0072153 A1 | 4/2003 | Matsui et al. | 362/231 |
| 2003/0142500 A1 | 7/2003 | Bachl et al. | 362/373 |
| 2004/0052077 A1 | 3/2004 | Shih | 362/294 |
| 2004/0120156 A1 | 6/2004 | Ryan | 362/373 |
| 2004/0184272 A1 | 9/2004 | Wright et al. | 362/373 |
| 2004/0264195 A1 | 12/2004 | Chang et al. | 362/294 |
| 2006/0145334 A1* | 7/2006 | Tsukada et al. | 257/706 |

* cited by examiner

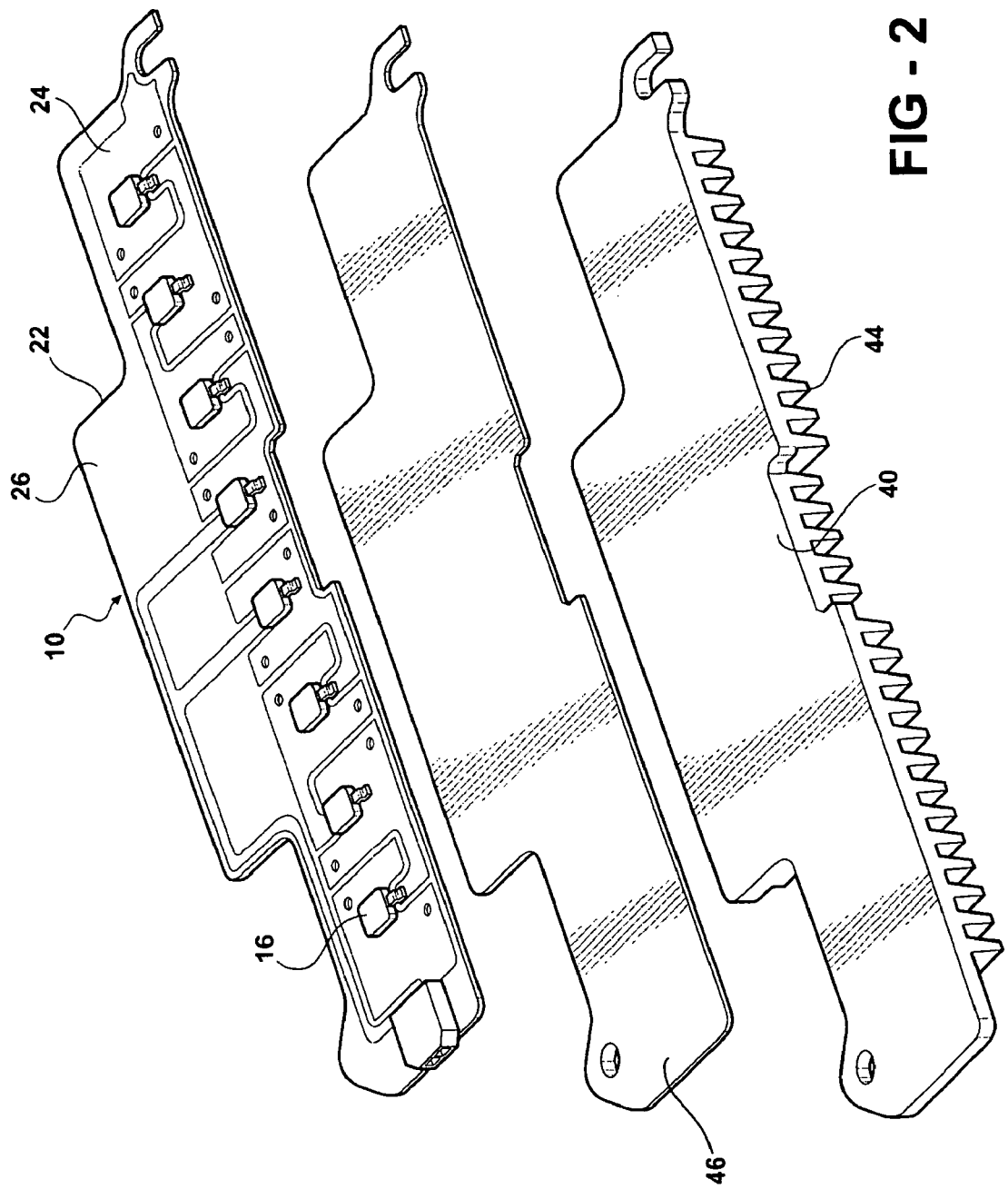

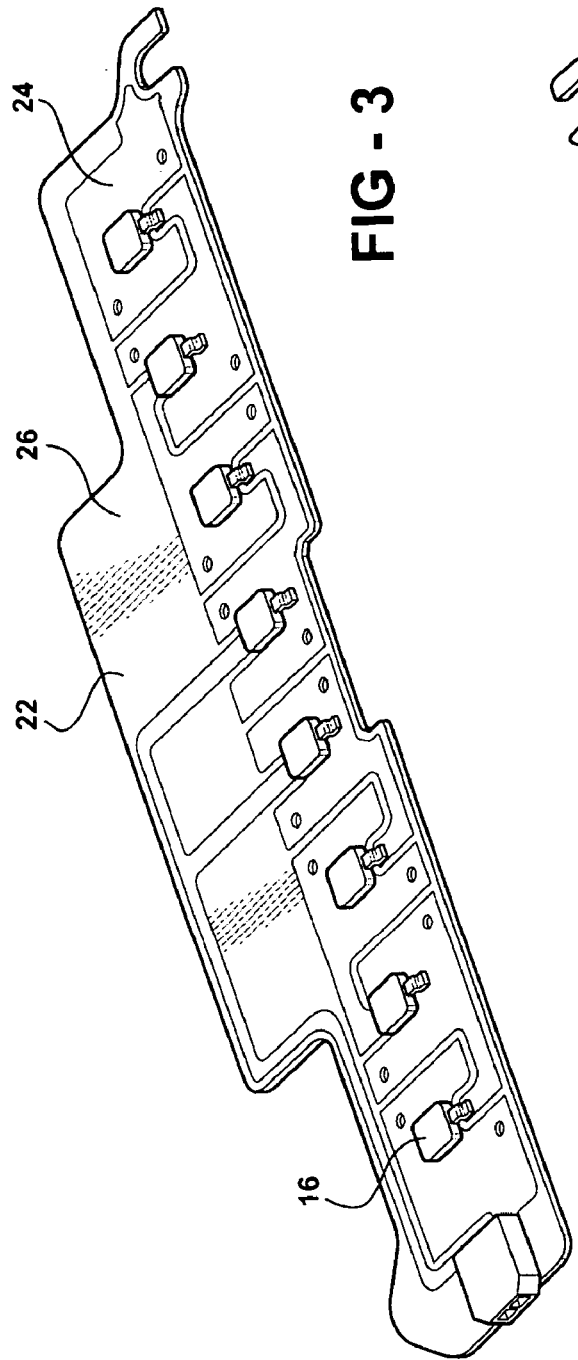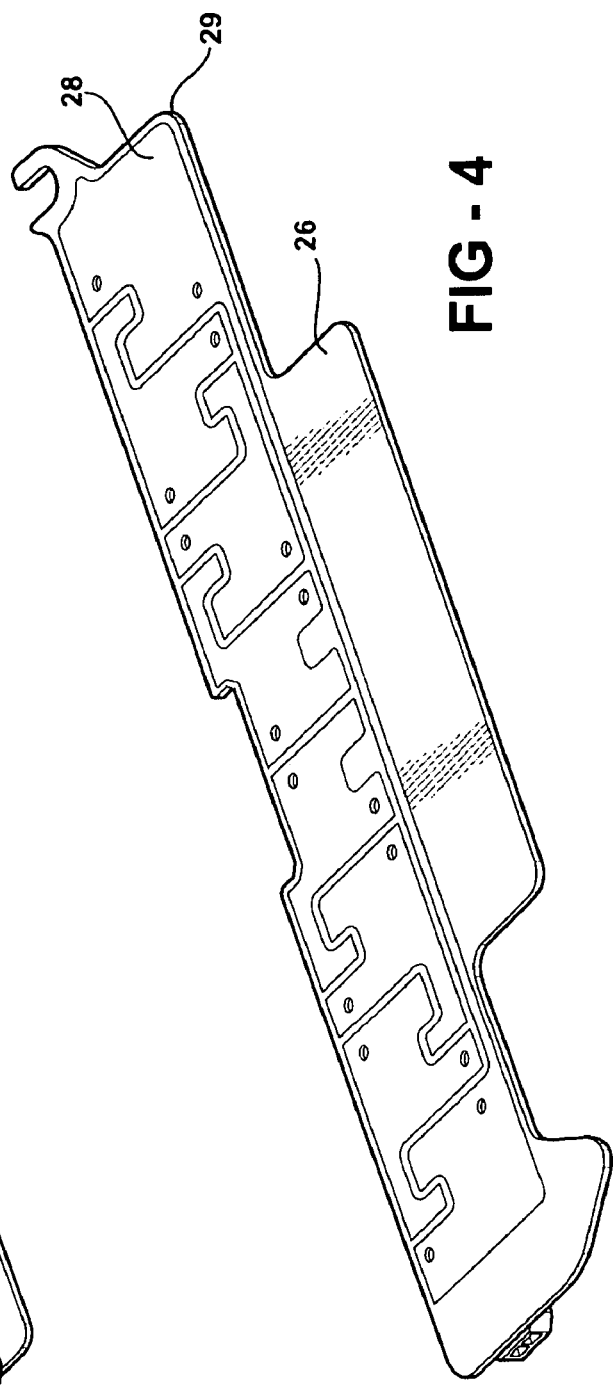

LED LIGHT MODULE ASSEMBLY

CROSS-REFERENCES TO RELATED APPLICATIONS

This patent application claims priority to U.S. Provisional Patent Application Ser. No. 60/654,027, filed Feb. 17, 2005 which is incorporated herein by reference in its entirety.

BACKGROUND OF THE INVENTION

1. Technical Field

This invention relates generally to lighting assemblies. More particularly, it relates to LED light module assemblies. Most particularly, it relates to LED light module assemblies for high-power LED arrays having controlled thermal pathways and heat sinks to remove the heat generated by operation of the LED's and associated electronics.

2. Related Art

Lighting modules which utilize light emitting diodes (LED) as light sources are used currently in a wide variety of lighting applications, including automotive applications. Because of their ability to provide a relatively high light output per unit area and their ability to be flexibly arranged into modular light arrays of various configurations, the commercial demand for LED light module assemblies is currently increasing.

Of particular interest is the development and recent commercial availability of higher light output, higher power LED's, such as those made from InGaAlP or InGaN semiconductor materials which use power in the range of 1-5 W and higher. These high power, high light output LED's typically have recommended temperature operating limits. One of these limits is specified with respect to the maximum temperature of the p-n junction that makes up the LED, and is referred to as the junction temperature. For example, in the case of one commercially available InGaAlP LED device, the maximum junction temperature ($T_j$) is specified as 125° C. Other LED devices made using different semiconductor materials and/or processing methods have different but similar operating temperature limits. While significant advances have been made in improving the light output and reducing the size of LED's, their commercialization has been somewhat limited in part by difficulties associated with the removal of the increased amounts of heat generated by these higher power devices using existing electronics packaging technology and lighting module designs. Presently, such LED's are generally packaged into lighting modules using standard G10/FR4, CEM and other printed circuit board materials and their associated component packaging and bonding technologies, without the use of heat sinks or other means of removing the increased amounts of heat from the modules and improving the thermal management and control of the lighting modules.

In addition to the increased power consumption of the LED's, there is also a desire to increase the packaging density of the LED's on the circuit boards into ever denser arrays and other configurations, which correspond to higher light outputs per unit area, but also increase the power densities and operating temperatures of these devices, and further compounds the problems associated with thermal management of lighting modules which incorporate them and maintaining the necessary operating limits, such as $T_j$. This is particularly the case for high density LED arrays. However, increases in packaging density have been limited by the thermal management issues described above.

In addition to the limitations associated with packaging high power, high density LED's described above, the current state-of-the-art of electronic packaging technology for LED's used in lighting module applications is not particularly well adapted for handling and assembly using high volume assembly methods. For example, surface mounting with reflow soldering of the LED's on the circuit boards using standard techniques is either currently not feasible and/or extremely difficult with many of these newly released LED high power packages. Additionally, high volume automation and integration of the aforementioned thermal pathways and/or heat sinks into, through, and around the LED lighting modules have not been demonstrated in large scale to date.

Therefore, it is desirable to overcome the limitations of the related art LED lighting module assemblies.

SUMMARY OF THE INVENTION

In one aspect, the present invention provides an LED lighting module assembly which includes: at least one LED that is operatively connected to a first surface of an LED carrier, the LED carrier having a carrier metallization on a second surface; a flexible circuit board comprising a first metallization layer, a dielectric layer and a second metallization layer, the dielectric layer located between the first metallization layer and the second metallization layer, the first metallization layer having defined thereon at least one LED attachment pad, the bonding pad having at least one via through the dielectric layer, the via having a via metallization layer which is joined to the first metallization layer and the second metallization layer; a first means for joining the carrier metallization layer to the LED attachment pad, which means is operative to provide a preferred thermal conduction path between the LED and the LED attachment pad; a metal heat sink having a base and a plurality of raised cooling fins extending away from the base; the fins being spaced apart from one another; and a second means for joining a portion of the second metallization which is proximate to the attachment pad and the via to the metal heat sink, which means is operative to provide a preferred thermal conduction path between the second metallization layer and the metal heat sink. This LED lighting module assembly is useful for a wide variety of lighting applications, including automotive lighting.

In a second aspect, the LED lighting assembly of the present invention may incorporate a plurality of LED light sources, including a spaced array of LED's. The spaced array of LED's may have a spacing as small as 16.7 mm center to center.

In a third aspect of this invention, the LED light module assembly may have a total power output in the range of 10-14 W while maintaining a junction temperature of less than about 125° C.

In a fourth aspect of the invention, the flexible circuit board may utilize a wide variety of copper clad flexible dielectric materials, including flexible polymer dielectric materials, and particularly including polyimide-based polymers, polyester-based polymers and polyethylene napthalate-based polymers.

In a fifth aspect of the invention, each of the attachment pads associated with the plurality of LED's defines a conductive path having an area of about 196 mm² or larger.

In a sixth aspect of the invention, the metal heat sink is selected from a group consisting of Cu-based alloys, Al-based alloys and Mg-based alloys.

In a seventh aspect of the invention, the metal heat sink has a spaced apart, generally parallel, array of fins. For natural or unforced convective cooling of the metal heat sink, the spaced apart fins may have a center to center spacing in the range of 6-8 mm, and a height in the range of about 6-10 mm.

In an eighth aspect of the invention, the LED light module assembly of the present invention may be assembled using surface mount LED's and other electronic components such as capacitors, resistors and integrated circuit drivers, which may be mounted to the flexible circuit board and assembled using a single reflow operation. Further, by suitable selection of the second means for joining, such as a thermally cured epoxy adhesive, the flexible circuit board may be joined to the heat sink using the same heat cycle used to reflow the surface mount components.

BRIEF DESCRIPTION OF THE DRAWINGS

The patent or application file contains at least one drawing executed in color. Copies of this patent or patent application publication with color drawing(s) will be provided by the Office upon request and payment of the necessary fee. These and other features and advantages of the present invention will become more readily appreciated when considered in connection with the following detailed description and appended drawings, wherein:

FIG. 2 is an exploded view of the LED light module assembly of FIG. 1;

FIG. 3 is a perspective view of the top surface of a flexible circuit board;

FIG. 4 is a perspective view of the bottom surface of the flexible circuit board of FIG. 3;

DETAILED DESCRIPTION OF THE PREFERRED EMBODIMENT

Figure 1:
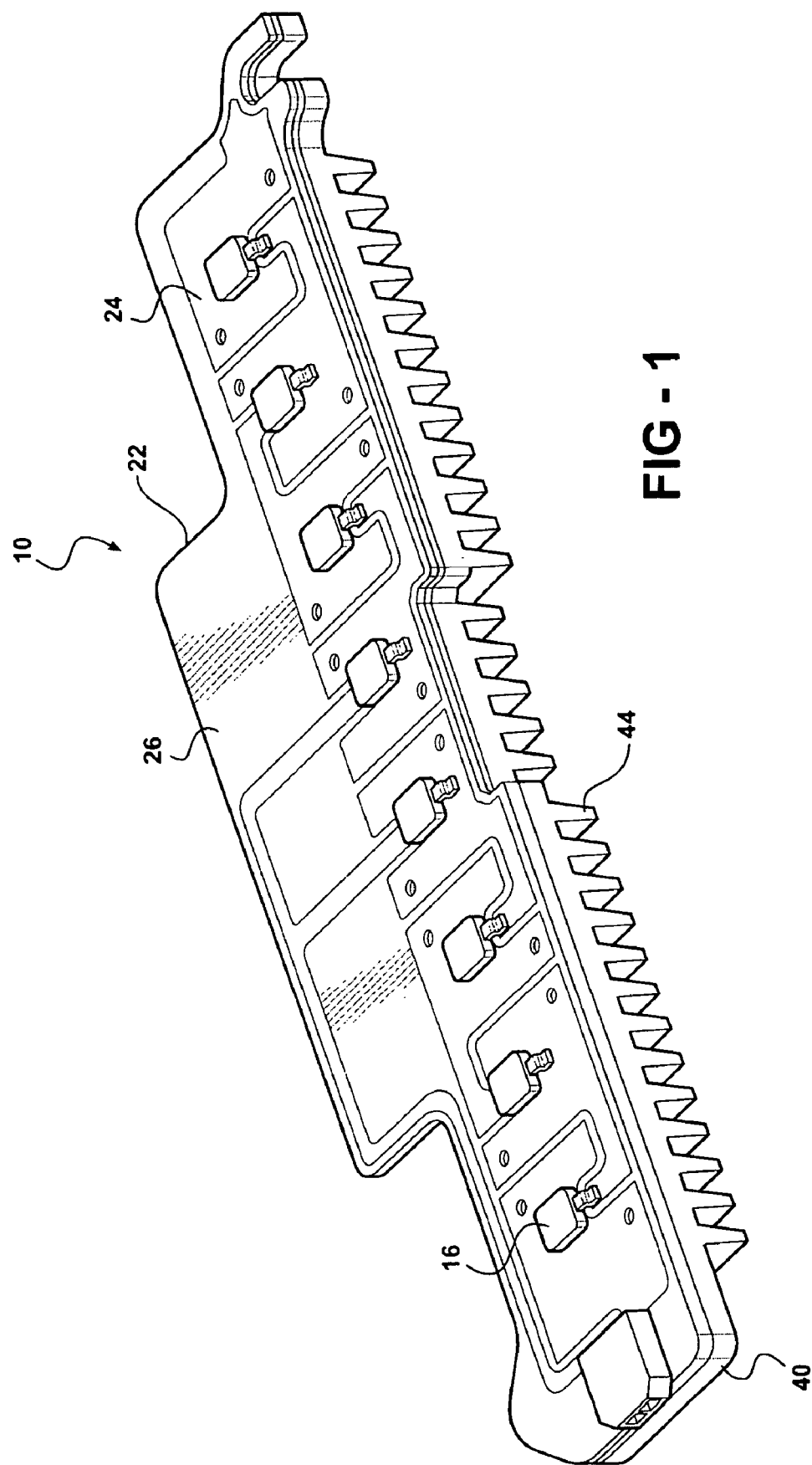
FIG. 1 is a perspective view of an LED light module assembly of the present invention.
Figure 5:
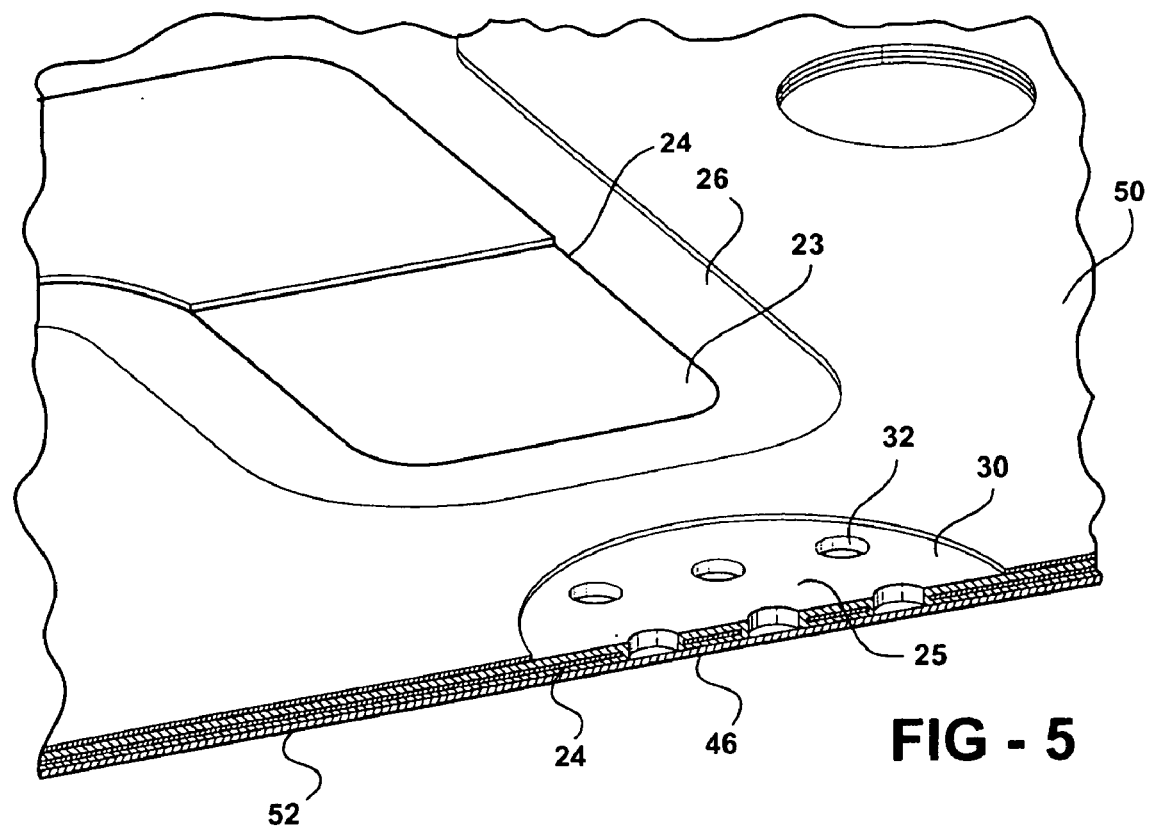
FIG. 5 is a perspective view of an attachment pad with via.
Figure 6:
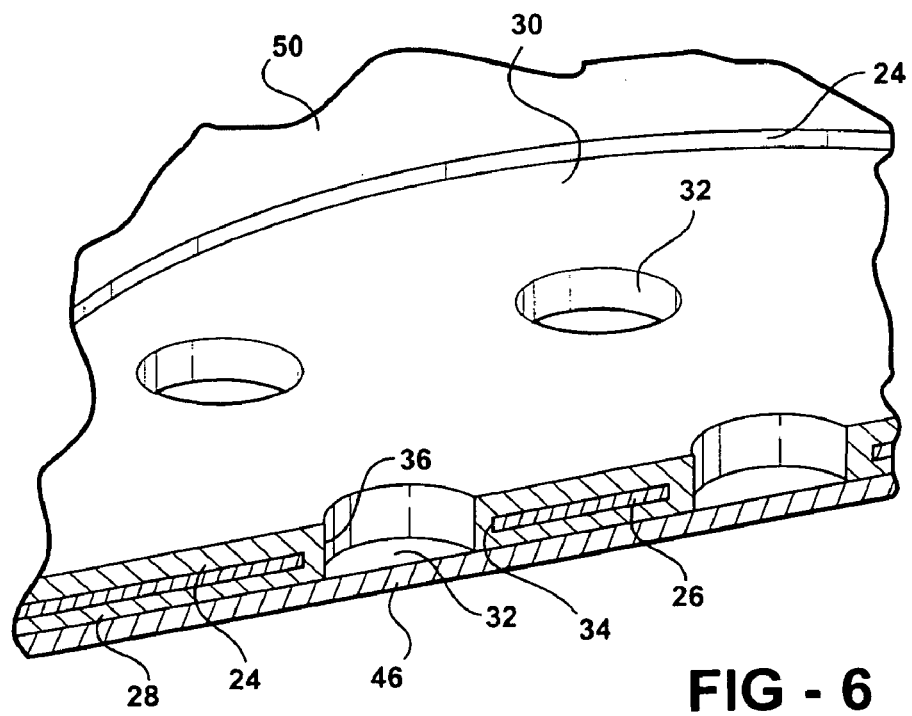
FIG. 6 is a perspective view of an enlarged portion of the attachment pad of FIG. 5.
Figure 8:
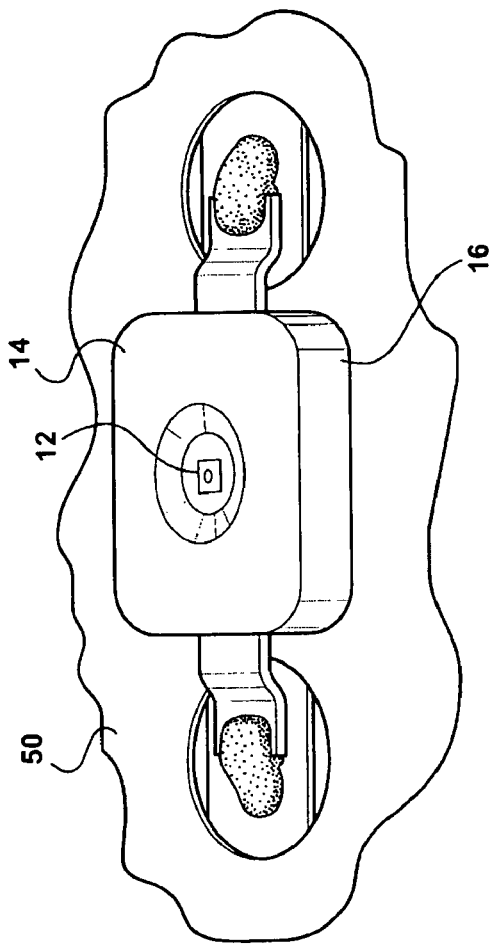
FIG. 8 is a perspective illustration of an LED and LED carrier which have been bonded to a flexible circuit board.

Referring to FIGS. 1-11, this invention is an LED lighting module assembly 10 for use in many lighting applications, including automotive lighting applications. The LED lighting module assembly 10 includes at least one LED 12 that is operatively connected to a first surface 14 of an LED carrier 16 (FIGS. 1 and 8). The LED carrier 16 also has a carrier metallization layer 18 on a second surface 20. The LED lighting module assembly 10 also includes a flexible circuit board 22 which includes a first metallization layer 24, a dielectric layer 26 and a second metallization layer 28. The dielectric layer 26 is located between the first metallization layer 24 and the second metallization layer 28. The first metallization layer 24 has at least one LED attachment pad 30 defined on it. The attachment pad 30 has at least one via 32 or opening which extends through the dielectric layer 26 from the first metallization layer 24 to the second metallization layer 28. The via 32 has around its periphery 34 a via metallization layer 36 which is joined to the first metallization layer 24 and the second metallization layer 28. The LED lighting module assembly 10 also includes a first means for joining 38 the metallization layer 18 of the carrier to the LED attachment pad 30. The first means for joining 38 is operative to provide a preferred thermal conduction path between the LED 12 and LED carrier 16 and the LED attachment pad 30. The LED lighting module assembly 10 also includes a metal heat sink 40 which has a base 42 and a plurality of raised cooling fins 44 which extend away from the base 42 and are spaced apart from one another. The LED lighting module assembly 10 also includes a second means for joining 46 a portion 48 of the second metallization 28 which is proximate to the attachment pad 30 and the via to the metal heat sink 40. The second means for joining 46 is operative to provide a preferred thermal conduction path between the second metallization layer and the metal heat sink 40. These elements of LED lighting module assembly 10 are explained in more detail below.

Figure 7:
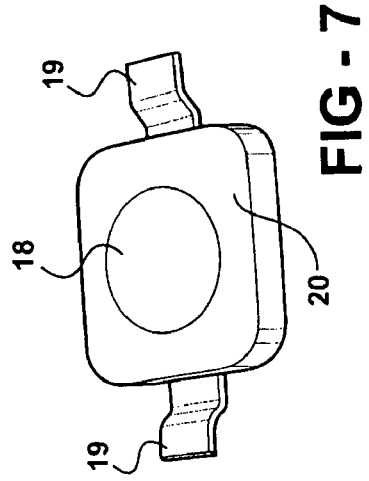
FIG. 7 is an illustration of an LED and LED carrier mounted on a tape such as used in tape and reel handling systems and the underside of a carrier, including the carrier metallization.
Figure 9:
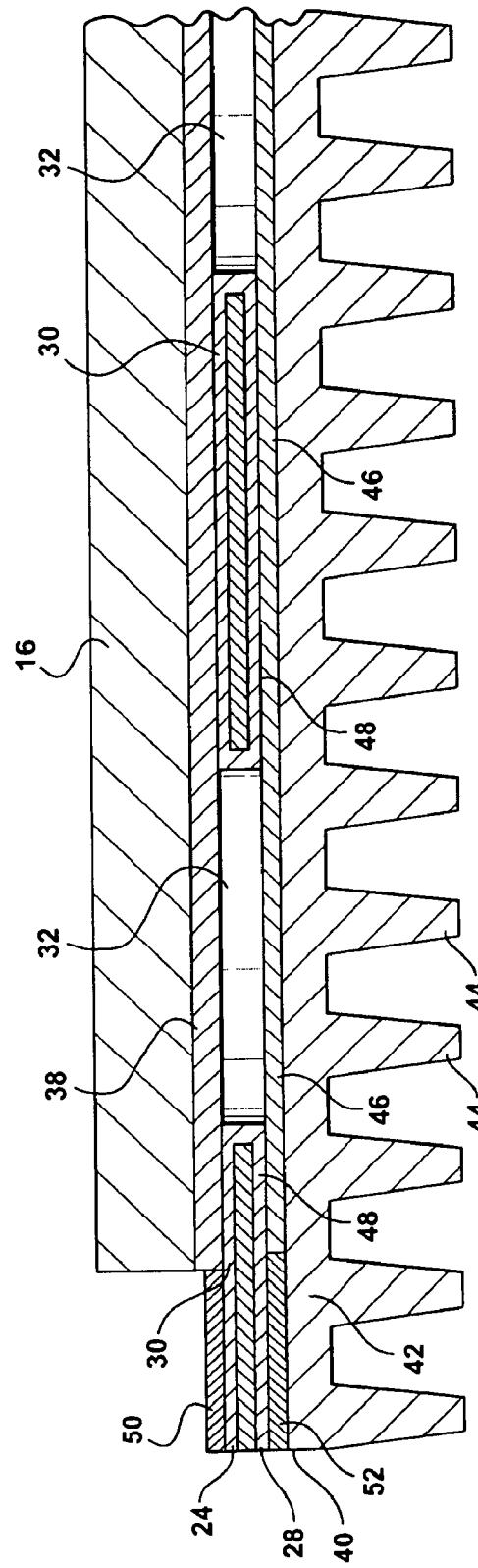
FIG. 9 is a partial section view of an LED lighting module assembly of the present invention.

The LED lighting module assembly 10 of the present invention is particularly well suited to house high power, high light output LED's, such as those which have a power output in the form of heat of about 1-5 W, such as those shown generally in FIGS. 7 and 8. The LED's may be made from InGaAlP or InGaN or other suitable semiconductor materials as are well known. Examples of such LED's are model numbers LA W57B-FYGY-24 and LY W57B-FIGY-26 manufactured by Osram Opto Semiconductors GmbH. Based upon thermal modeling analysis, it is believed that the LED lighting module assembly 10 of the present invention is adapted to operate with a combined thermal output from all LED's of the assembly of between about 10-14 W, while maintaining the junction temperature of all devices on the module below the maximum recommended junction temperature (which is approximately 125° C. depending upon the particular LED and underlying semiconductor materials used in its construction) for ambient operating temperatures up to about 58° C. The LED's 12 are housed or packaged into a carrier 16 of known construction in order to facilitate handling of the LED 12 devices and their packaging into higher level electronic assemblies. These packages typically have two metal leads 19 which are used to provide power to the LED 12. LED 12 is mounted to a first surface, typically an upper surface, of LED carrier 16. LED carrier 16 also includes on a second surface, typically on a lower surface opposite the first surface, a carrier metallization 18 which is used to provide a physical attachment of carrier 16 to a substrate as well as a thermal conduction path to remove heat from LED carrier 16 and LED 12 during the operation of LED 12.

LED's 12 and LED carriers 16 are mounted onto a flexible circuit board 22 (see FIG. 1 and FIG. 8). Flexible circuit board 22 is used to provide power to LED's 12 and LED carriers 16 as well as a means of physical attachment of these devices. Flexible circuit board 22 represents an intermediate level of electronics packaging and provides a means of providing necessary electrical input and mechanical packaging of the higher level LED devices. Flexible circuit board 22 is a two sided circuit board having a dielectric layer 26 that is located between the first metallization layer 24 and the second metallization layer 28. In the example of the embodiment of FIGS. 1-11, first metallization layer 24 is used to define circuit paths for providing an electrical signal to the terminals 19 of LED carrier 16. First metallization layer 24 also acts as a thermal conduction path to spread the heat generated by the LED's across a substantial portion of the upper surface of the flexible circuit board 22, and thereby provides an alternate or secondary heat conduction path from the first metallization layer 24 through the dielectric layer 26 to the second metallization layer 28, where it can then be conducted through the thermal adhesive 46 into the heat sink 40. Therefore, it is desirable that first metallization layer 24 be designed so as to cover as much of the upper surface of the flexible circuit board 22 as possible, while still permitting definition of the necessary circuit paths to the LED's and other electrical devices which may be mounted on this side of the circuit board. Second metallization layer 28 is used as a thermal back plane for the circuit board and as a part of the thermal conduction path from the LED's 12 and LED carrier 16 through to the heat sink 40. Second metallization layer 28 may also be used to provide electrical circuit paths, either separate from or associated with the electrical circuit paths in the first metallization layer 24, as is well known. First metallization layer 24 and second metallization layer 28 may also be electrically interconnected using electrically conductive vias or other means. In the case where carrier metallization 18 is not electrically neutral (e.g., forms a part of the electrical circuit used to energize the LED), it is generally preferred to provide electrical isolation between the second metallization layer 28 and the metal heat sink 40, such as by utilizing an electrically insulating second means for joining 46, or by electrically isolating the metal heat sink 40 (e.g., by anodization) or by use of a second dielectric solder mask 52 over a portion of the outer surface of second metallization layer 28. Flexible circuit board 22 obtains its flexibility from the thicknesses of the materials utilized for first metallization layer 24, dielectric layer 26 and second metallization layer 28. While flexibility of the circuit board is desirable with respect to handling and the ability to utilize the flexible circuit board in conjunction with tape and reel handling equipment which is well suited to high volume, automated assembly and manufacturing, flexibility of circuit board 22 is not essential to the invention. Flexible circuit board 22 could also be substituted for a rigid circuit board of similar dimensions, electrical properties and thermal in accordance with the LED lighting module assembly 10 of the present invention. It is desirable to minimize the thickness of dielectric layer 26 in order to improve the thermal conduction path of which it is a part. Dielectric layer 26 is preferably about 25 microns thick and any suitable dielectric material may be utilized, including polyimide-based materials, polyester-based materials and polyethylene napthalate-based materials. First metallization layer 24 and second metallization layer 28 may be of any suitable thickness, depending upon the particular application. In one exemplary embodiment, first metallization layer had a thickness of about 50 microns and second metallization layer had a thickness of about 35 microns. First metallization layer 24 and second metallization layer 28 may be made from any of a number of known metallizations used in the manufacture of printed circuit boards, including any of a number of known Cu-based alloys. In the exemplary embodiments of FIGS. 1-11, first metallization layer 24 will preferably have attached to an outer surface a dielectric solder mask 50 (see FIGS. 5, 6 and 8). Solder mask 50 is used to isolate and protect underlying elements of the circuit and define portions of first metallization 24 which are used for attachment and bonding of terminals 19 and carrier metallization 18. First portions 23 of first metallization 24 are used for attachment and bonding of terminals 19 and second portions 25 of first metallization 24 are used as attachment pads 30 for bonding and attachment of carrier metallization 18. Attachment pad 30 also has associated with it at least one via 32 which extends through first metallization layer 24, dielectric layer 26 and second metallization layer 28. Via 32 also includes a via metallization layer 36 which is joined to and continuous with the associated portions of first metallization layer 24 and second metallization layer 28. If a plurality of attachment pads 30 are utilized in conjunction with an associated plurality of LED's 12 and LED carriers 16, each of attachment pads 30 will incorporate at least one via 32; however, it is preferred that attachment pad 30 incorporate a plurality of vias 32. Vias 32 may be formed by punching or drilling, including mechanical or laser drilling, or using other well known techniques for forming vias. Via metallization 36 may be added to flexible circuit board 22 by any suitable technique including electroplating or electroless plating of via metallization layers 36. Flexible circuit boards 22 may be manufactured by cladding first metallization layer 24 and second metallization layer 28 using well known methods for the manufacture of two sided flexible circuit boards.

LED lighting module assembly 10 also incorporates a first means for joining 38 the carrier metallization layer 18 to the attachment pad 30. The first means for joining 38 is operative to provide a preferred thermal conduction path between the heat source, namely LED 12 and associated LED carrier 16, down to the LED attachment pad 30. By a preferred thermal conduction path, it is meant that the conduction path is preferred to other paths for the removal of heat from LED 12 and LED carrier 16, such as convection and/or radiation of thermal energy. The first means for joining 38 is preferably a layer of solder which is applied to both first portions 23 and second portions 25 of first metallization layer 24 in the form of a solder paste or perform. LED carrier 16 may then be placed onto these portions of flexible circuit board 22. Following such placement, the LED carriers and flexible circuit board may be subjected to a heat source, such as a continuous belt IR oven, in order to reflow the solder paste and form solder joints between the carrier terminals 19 and first portions 23 of first metallization layer 24 and carrier metallization layers 18 and second portions 25 of first metallization layer 24, respectively (see FIGS. 8 and 9). Any suitable solder material may be utilized for first means for joining 38, including any of a number of Pb-based solders as are well known, as well as a number of Pb-free solders. In addition, it is believed that a number of thermally conductive adhesives may be suitable for employment as first means for joining 38, such as a number of thermally conductive epoxy adhesives.

LED light module assembly 10 also includes a metal heat sink 40 which is attached to flexible circuit 22 using second means for joining 46. Second means for joining 46 is preferably a layer of a thermally conductive adhesive which may be applied to either or both of the upper surface 49 of heat sink 40 or the lower surface 29 of flexible circuit board 22. Second means for joining 46 is operative to provide a preferred thermal conduction path between the second metallization layer 28 and the metal heat sink 40, particularly in the portions 48 of second metallization layer 28 that are proximate to first means for joining 38. This is to provide continuity of the preferred thermal conduction path between LED 12 and carrier 16 through first means for joining 38, first metallization layer 24, via metallization layer 36 and second metallization layer 28, and also through the portion of second means for joining 46 which is proximate to LED attachment pad 30 and into heat sink 40. Any of a number of thermally conductive adhesives may be employed as second means for joining 46, including a number of thermally conductive epoxy adhesives. One example of a suitable thermally conductive adhesive is thermally conductive epoxy adhesive identified as TC 2810 made by 3M Corporation. This material is a boron nitride filled, two-part, thermally conductive epoxy adhesive.

Figures 10, 11:
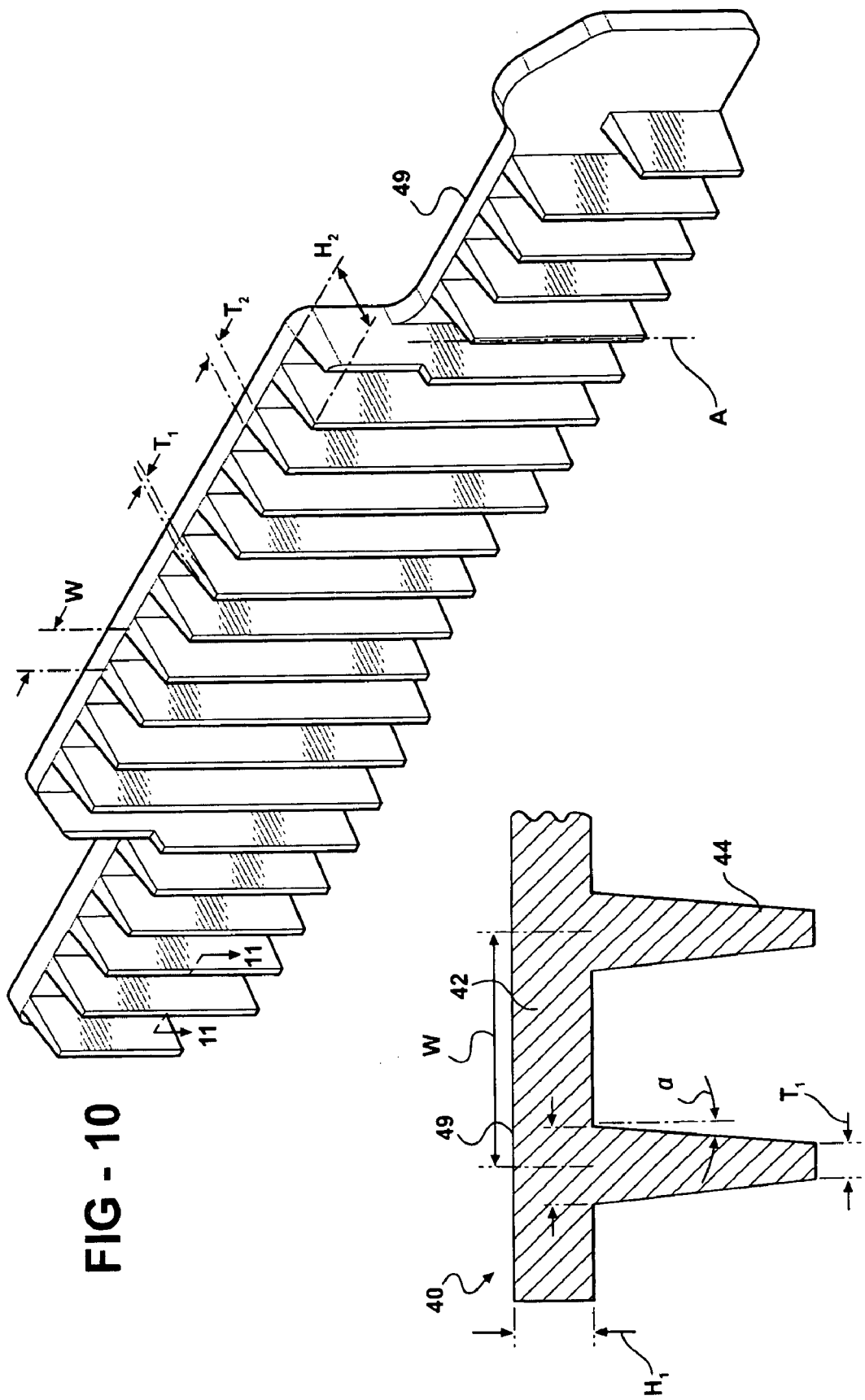
FIG. 10 is a perspective view of a heat sink.
FIG. 11 is a section view taken along line 11-11 of FIG. 10.

Metal heat sink 40 has a base 42 and a plurality of raised cooling fins 44 which extend away from the base 42 and are spaced apart from one another. In a preferred embodiment, cooling fins 44 have a tapered profile as illustrated in FIGS. 10 and 11. Raised cooling fins 44 extend generally parallel to one another with respect to an axes A defined at the tips of the raised cooling fins 44. In many applications of LED light module assembly 10, it is desirable to operate the module with only naturally occurring or unforced convection of the module for removing the heat generated by LED's 12 from the metal heat sink 40. In such conditions, applicant has determined that there exists a preferred configuration of raised cooling fins 44 which will enable the junction temperature of the LED's to be maintained at a temperature less than a maximum recommended junction temperature (e.g., 125° C.) for a combined thermal load from all LED's of between 10-14 W and ambient temperatures up to about 58° C. This configuration includes a center to center spacing of the raised cooling fins 44 of 6-8 mm. In this configuration, it is also preferred that the raised cooling fins 44 have a maximum height ($H_2$) above the base in the range of about 6-10 mm it is further preferred that the fins have a tapered thickness profile, and taper from a tip thickness ($T_1$) to a root thickness ($T_2$) according to a draft angle ($\alpha$) as shown in FIG. 11. It is believed that the minimum tip thickness is between about 1.0-1.5 mm for molded or cast metal heat sinks of Mg-based and Al-based alloys, respectively without a need for subsequent machining operations. It is also preferred that the base 42 of metal heat sink 40 have a thickness or height ($H_1$) of 3 mm or greater. While any suitable metal may be used for metal heat sink 40, it is believed that Cu-based alloys, Al-based alloys and Mg-based alloys are preferred, particularly in order to mold or cast heat sink 40.

Table 1 provides information about the thicknesses, thermal expansion coefficients and thermal conductivity of various elements of one embodiment of LED light module assembly 10, particularly elements associated with the preferred thermal conduction path described herein. As noted above, the minimum center to center spacing of LED's using LED light module assembly 10 while maintaining a junction temperature which is less than the maximum recommended junction temperature of 125° C. is about 16.7 mm center to center. It has also been determined that the area of attachment pad 30 is an important consideration with regard to the effectiveness of the preferred thermal conduction path and the ability to maintain temperatures of the LED's below the maximum recommended junction temperature. In this regard, the minimum area of attachment pad 30 has been determined to be about 196 $mm^2$. Attachment pad 30 may be covered in part and extend under solder mask 50.

TABLE 1

|  | Thickness | Thermal Expansion (CTE) | Thermal Conductivity (k) |
| --- | --- | --- | --- |
| First means for joining (PbSn Solder) | 100 μm | 28.7 | 36 |
| Solder Mask | 35 μm | xx | 0.20 |
| First Metallization Layer (Cu Alloy) | 50 μm | 17 | 391 |
| Dielectric Layer (polyethylene napthalate) | 25 μm | 20 | 0.12 |
| Second Metallization Layer (Cu Alloy) | 35 μm | 17 | 391 |
| Thermally Conductive Adhesive | 36 μm | 62 | 1 |
| Heat Sink Base ($H_1$) | 5 mm | 21 | 109 |
| Heat Sink Fin ($H_2$) | 7 mm | 21 | 109 |

The LED light module assembly of the present invention may be assembled using surface mount LED's and other electronic components such as capacitors, resistors and integrated circuit drivers, which may be mounted to the flexible circuit board and assembled using a single reflow operation. Further, by suitable selection of the second means for joining, such as a thermally cured epoxy adhesive, the flexible circuit board may be joined to the heat sink using the same heat cycle used to reflow the surface mount components.

Obviously, many modifications and variations of the present invention are possible in light of the above teachings. It is, therefore, to be understood that within the scope of the appended claims, the invention may be practiced otherwise than as specifically described.

What is claimed is:

1. An LED lighting module assembly, comprising:
   at least one LED that is operatively connected to a first surface of an LED carrier, said LED carrier having a carrier metallization layer on a second surface;
   a flexible circuit board comprising a first metallization layer, a dielectric layer and a second metallization layer, the dielectric layer located between the first metallization layer and the second metallization layer, the first metallization layer having defined thereon at least one LED attachment pad, the LED attachment pad having at least one via through the dielectric layer, the via having a via metallization layer which is joined to the first metallization layer and the second metallization layer;
   a first means for joining the carrier metallization layer to the LED attachment pad, which means is operative to provide a preferred thermal conduction path between the LED and the LED attachment pad;
   a metal heat sink having a base and a plurality of raised cooling fins extending away from the base, the fins being spaced apart from one another; and
   a second means for joining a portion of the second metallization which is proximate to the LED attachment pad and the via to the metal heat sink, which means is operative to provide a preferred thermal conduction path between the second metallization layer and the metal heat sink.

2. The assembly of claim 1, wherein said at least one LED comprises a plurality of LED's which are associated with a corresponding plurality of LED attachment pads and at least a corresponding plurality of vias.

3. The assembly of claim 2, wherein the plurality of LED's is arranged in a spaced array of LED's.

4. The assembly of claim 3, wherein the spaced array has a center to center spacing of the LED's of about 16.7 mm or greater.

5. The assembly of claim 2, wherein the maximum power output of the plurality of LED's is in the range of 10-14 W of heat load.

6. The assembly of claim 2, wherein the at least one via comprises a plurality of spaced apart vias associated with each of the plurality of LED's.

7. The assembly of claim 6, wherein each of the LED attachment pads defines a conductive path having an area of about 196 mm² or larger.

8. The assembly of claim 1, wherein said first joining means comprises a metal alloy located between and joined by a metallurgical bond to the first metallization layer and the carrier metallization layer.

9. The assembly of claim 8, wherein the first metallization layer and the second metallization layer comprise a Cu-based alloy.

10. The assembly of claim 9, wherein the metal alloy is a solder.

11. The assembly of claim 10, wherein the solder is a Pb-free solder.

12. The assembly of claim 1, wherein said first joining means comprises a thermally conductive adhesive.

13. The assembly of claim 1, wherein said second joining means comprises a thermally conductive adhesive.

14. The assembly of claim 13, wherein the thermally conductive adhesive is a thermally conductive epoxy.

15. The assembly of claim 1, wherein said metal heat sink comprises a metal selected from a group consisting of Cu-based alloys, Al-based alloys and Mg-based alloys.

16. The assembly of claim 1, wherein the raised fins of said metal heat sink are spaced apart as a generally parallel array of fins.

17. The assembly of claim 1, wherein the spaced apart fins have a center to center spacing in the range of 6-8 mm.

18. The assembly of claim 17, wherein the fins have a height above the base in the range of about 6-10 mm.

19. The assembly of claim 18, wherein the fins have a tapered thickness profile, tapering from a tip thickness to a root thickness according to a draft angle, and wherein the tip thickness is less than about 1.5 mm and the draft angle is in the range of about 1-4 degrees.

20. The assembly of claim 19, wherein the base has a thickness which is 3 mm or larger.

21. The assembly of claim 1, wherein said dielectric layer is a polymer.

22. The assembly of claim 21, wherein the polymer is selected from a group consisting of polyimide-based polymers, polyester-based polymers and polyethylene napthalate-based polymers.

23. The assembly of claim 1, further comprising a first dielectric solder mask applied over an outer surface of the first metallization and a second dielectric solder mask applied over an outer surface of the second metallization.

* * * * *